United States Patent [19]

Anthony et al.

[11] Patent Number: 5,096,736
[45] Date of Patent: Mar. 17, 1992

[54] CVD DIAMOND FOR COATING TWIST DRILLS

[75] Inventors: Thomas R. Anthony, Schenectady; William F. Banholzer, Scotia; Robert H. Ettinger, Schenectady; James F. Fleischer, Scotia, all of N.Y.

[73] Assignee: General Electric Company, Worthington, Ohio

[21] Appl. No.: 563,367

[22] Filed: Aug. 7, 1990

[51] Int. Cl.$^5$ ..................... C23C 16/26; C23C 16/48; C23C 16/50
[52] U.S. Cl. ........................................ 427/38; 427/39; 427/249; 423/446; 118/723
[58] Field of Search .................... 118/723; 423/446; 427/38, 39, 249

[56] References Cited

U.S. PATENT DOCUMENTS 4,953,499  9/1990  Anthony et al. .................... 118/724

FOREIGN PATENT DOCUMENTS 230927    8/1987  European Pat. Off. ............. 423/446
60-122795 7/1985  Japan ................................. 423/446

Primary Examiner—Shrive Beck
Assistant Examiner—Margaret Burke
Attorney, Agent, or Firm—Mueller and Smith

[57] ABSTRACT

The present invention enables the diamond coating of stationary elongate objects, such as twist drills, with a continuous uniform film without any motion of the twist drill due to the unexpected superb "throwing power" of a reactor disclosed herein. The CVD diamond reactor includes a vacuum chamber, inlet for feed hydrogen/hydrocarbon mixtures, and an outlet, in conventional fashion. The improvement for coating with CVD diamond the entire outer surface of at least a portion of a plurality of stationary elongate objects comprises disposed within said reactor, an elongate metal tube having a plurality of apertures for holding elongate objects disposed radially inwardly and having a cooling pipe in thermal contact with and disposed about the outside of said metal tube; and a filament running within said tube along its lengthwise extent and being in electrical connection with the source of voltage for heating said filament to a temperature adequate to initiate hydrocarbon disassociation, the portions of said elongate object within said tube surrounding said filament being heated thereby.

5 Claims, 4 Drawing Sheets

CVD DIAMOND FOR COATING TWIST DRILLS

BACKGROUND OF THE INVENTION

The present invention relates to diamond coating of workpieces and more particularly to an improved reactor design and process therefor.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide support in cylindrical or annular form, extended the product line for diamond additionally. However, the requirement of high pressure and high temperature has been a limitation in product configuration, for example.

Recently, industrial effort directed toward the growth of diamond at low pressures, where it is metastable, has increased dramatically. Although the ability to produce diamond by low-pressure synthesis techniques has been known for decades, drawbacks including extremely low growth rates prevented wide commercial acceptance. Recent developments have led to higher growth rates, thus spurring recent industrial interest in the field. Additionally, the discovery of an entirely new class of solids, known as "diamond like" carbons and hydrocarbons, is an outgrowth of such recent work.

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1750° to 2400° C. The gas mixture disassociates at the filament surface and diamonds are condensed onto a heated substrate placed just below the hot tungsten filament. The substrate is held in a resistance heated boat (often molybdenum) and heated to a temperature in the region of about 500° to 1100° C.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

Heretofore, CVD diamond has been coated onto tungsten carbide or other substrates to make cutting tool inserts (U.S. Pat. Nos. 4,707,384 and 4,731,296) or co-deposited with boron or another element for making semiconductors (e.g. EP Publications Nos. 286,306 and 282,054). In coating workpiece surfaces disposed opposite the heated filament (e.g. the back sides of twist drills), rotating the workpiece to ensure complete coverage is an extra process step to be avoided.

BROAD STATEMENT OF THE INVENTION

The present invention enables the diamond coating of stationary elongate objects, such as twist drills, with a continuous uniform film without any motion of the twist drill due to the unexpected superb "throwing power" of a reactor disclosed herein. The CVD diamond reactor includes a vacuum chamber, inlet for feed hydrogen/hydrocarbon mixtures, and an outlet, in conventional fashion. The improvement for coating with CVD diamond the entire outer surface of at least a portion of a plurality of stationary elongate objects comprises disposed within said reactor, an elongate metal tube having a plurality of apertures for holding elongate objects disposed radially inwardly and having a cooling pipe in thermal contact with and disposed about the outside of said metal tube; and a filament running within said tube along its lengthwise extent and being in electrical connection with the source of voltage for heating said filament to a temperature adequate to initiate hydrocarbon disassociation, the portions of said elongate object within said tube surrounding said filament being heated thereby.

Another aspect of the present invention is a method for coating with CVD diamond the entire outer surface of at least a portion of a plurality of stationary elongate objects wherein a flow of hydrogen/hydrocarbon mixture is passed into a vacuum chamber of a diamond reactor held under CVD diamond-forming conditions wherein the mixture is disassociated for diamond deposition/growth on a substrate disposed therein. The improvement in process comprises passing said feed hydrogen/hydrocarbon mixture through an elongate metal tube disposed within said reactor which tube has a plurality of apertures which hold elongate objects disposed radially inwardly and which has a cooling pipe in thermal contact with and disposed about the outside of said metal tube. A filament running within said tube along its lengthwise extent and which is in electrical connection with a source of voltage for its heating is heated to a temperature adequate to initiate hydrocarbon disassociation. The heated filament heats the elongate objects and cooling fluid passing through the cooling pipe is adjusted to maintain the elongate objects at a CVD diamond-forming temperature.

Advantages of the present invention include a reactor design and process that enables the coating of the entire surface of elongate objects within a CVD reactor without having to rotate the objects to accomplish such coating. Another advantage is the ability to coat a plurality of such stationary elongate objects. These and other advantages will be readily apparent based upon the disclosure contained herein.

BRIEF DESCRIPTION OF THE DRAWINGS p

The drawings will be described in detail in connection with the following description of the invention.

DETAILED DESCRIPTION OF THE INVENTION

Twist drills are used extensively in the industrial world. The hardest and longest lasting twist drills are manufactured of tungsten carbide. Even tungsten carbide twist drills suffer premature failure when drilling some composite materials. One means for making such twist drills even harder is to deposit a coating of CVD diamond thereon. The superb "throwing power" of the reactor design disclosed herein enables twist drills to be coated in a stationary position with a continuous uniform film about their entire external surface including the head and flutes. This ability is surprising since CVD reactors operate using a gas flow passed from an inlet to an outlet of the reactor wherein the hydrocarbon is disassociated and the disassociated mixture deposited on a substrate in the flow path of the disassociated reaction mixture. Thus, it would be expected that the twist drills would need to be rotated in order for the oppositely disposed or trailing side in the gas flow to similarly be coated as the leading surface is coated.

Figure 1:
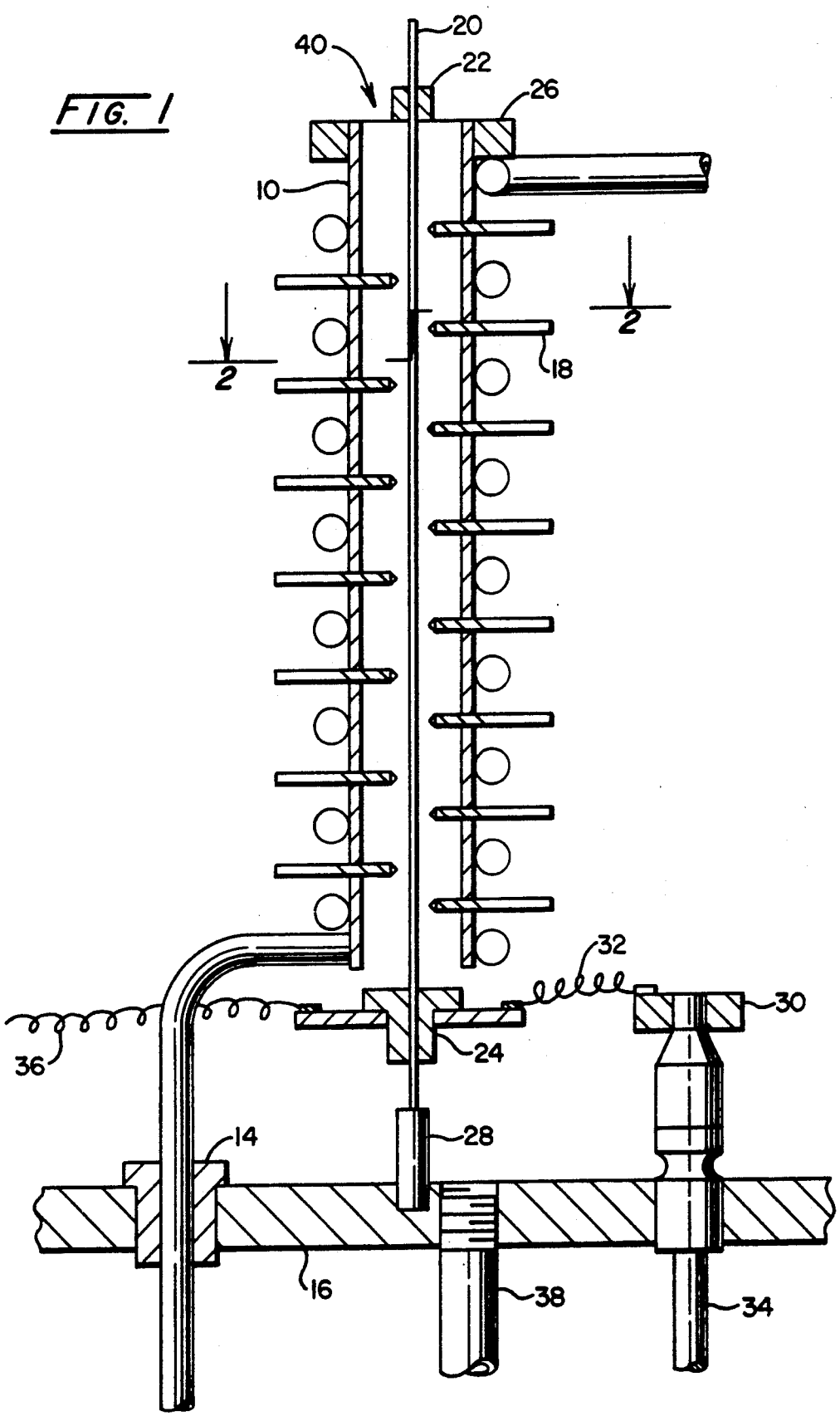
FIG. 1 is a cross-sectional elevational view of the reactor components enabling the coating of stationary twist drills.

Referring to the reactor design illustrated in FIG. 1, elongate copper tube 10 is supported at its upper and lower end by copper cooling pipe 12 which is wrapped in a helical pattern about copper tube 10. The lower end of copper tube 12 through which water or other cooling fluid flows passes through Teflon seal 14 in table 16 which is manufactured from suitable refractory material (e.g. molybdenum) with the cooling fluid being withdrawn about its upper end. Copper tube 12 has a plurality of apertures in a helical parallel pattern to the cooling pipe in which twist drills, e.g. drill 18, are disposed radially inwardly. While elongate copper tube 10 preferably is cylindrical, other geometric patterns (e.g. hexagonal, octagonal, etc.) also may be used is necessary, desirable, or convenient. Depending upon the size of copper tube 10 and representative twist drill 18, a plurality of twist drills can be retained for simultaneously coating with CVD diamond.

Filament 20 is suitably composed of tungsten, tantalum, or other refractory material. Filament 20 runs within copper tube 10 along its lengthwise extent between upper molybdenum block 22 and lower molybdenum block 24. Again, blocks 22 and 24 can be composed of other refractory material as also is appropriate for filament 20. Upper molybdenum block 22 is fastened to copper tube 10 with insulating quartz pins 26 that electrically isolate block 22 from copper tube 10. Lower block 24 is suspended by filament 20 and constrained to vertical motion by quartz guide tube 28 which is retained in table 16 and in which the lower end filament 20 is disposed. Filament 20 will be subject to motion during heating and cooling cycles during reactor use and it is desired to establish a uniform spacing between filament 20 and the twist drills disposed in copper tube 10.

Floating lower block 24 is connected to molybdenum block 30 by flexible copper braid 32 which, in turn, is connected to power line 34 that runs through table 16. To complete electrical connection, flexible copper braid 36 also is connected to lower floating block 24. Power line 34 and copper braid 36 are connected to a source of D.C. or A.C. voltage not shown in FIG. 1 but described in connection with FIG. 4 below. Vacuum line 38 is disposed through table 16 and is connected to a source of vacuum in conventional fashion. A metal or glass envelope is placed over the copper tube and filament and secured against table 16 to complete the reaction chamber components. Of course, a suitable inlet for admission of the hydrogen/hydrocarbon reaction mixture into the metal or glass envelope is provided also in conventional fashion.

Figure 2:
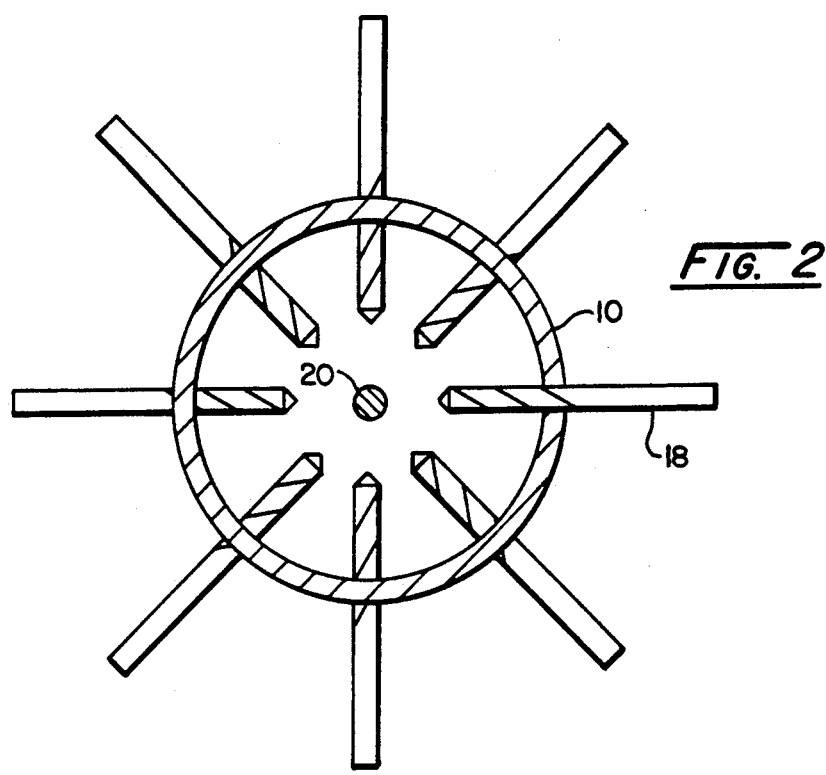
FIG. 2 is a sectional view taken along line 2—2 of FIG. 1.
Figure 3:
FIG. 3 is a twist drill that has been coated with CVD diamond by the reactor disclosed herein.

Referring to FIG. 2, the radial inward placement of typical drill bit 18 and the other drill bits will be observed. The spaced-apart relationship between prototype twist drill 18 and filament 20 also is readily apparent. Only the portion of twist drill 18 disposed on the inside of copper tube 10 is coated with CVD diamond since the hydrogen/hydrocarbon mixture passed through the inside of copper tube 10 is disassociated by filament 20. Depending upon the size, number, spacing, etc. of the twist drills, the distance between typical twist drill 18 and filament 20 can range from about 2 to 20 mm. This distance is maintained constant by virtue of quartz tube 28 that constricts movement of filament 20 in a vertical direction only. The resultant CVD diamond coated twist drill is set forth at FIG. 3. Typical twist drill 18 will be seen to have a coating of CVD diamond about its head and flutes for that extent that was disposed within the interior of copper tube 10. The Example will amplify on such CVD diamond coated twist drill.

Figure 4:
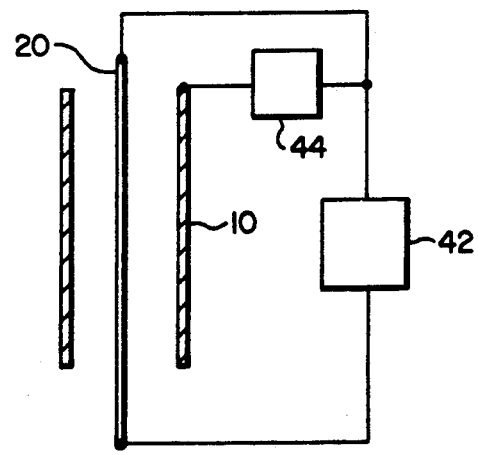
FIG. 4 is an electrical block schematical representation for heating the filament and optionally applying a bias voltage to the metal tube in which the twist drills are disposed.

With respect to the process for coating of twist drills and other elongate objects with a layer of CVD diamond, filament 20 is heated to between about 1750° and 2500° C. with D.C. or A.C. as can be seen by reference to FIG. 4. Voltage sources 42 and 44 can supply A.C. voltage or D.C. voltage. Copper tube 10 can be grounded or it too can be subject to d.c. or a.c. bias by voltage source 42. Since filament 20 is electrically isolated from copper tube 10 and filament 20 can be heated with D.C. or A.C., filament 20 also can be biased with respect to the twist drills which similarly are in electrical connection with copper tube 10 with negative or positive D.C. voltage supplied by voltage source 44. The various electrical combinations will be readily apparent to those skilled in the art.

With respect to conventional CVD processes useful in the present invention, hydrocarbon/hydrogen gaseous mixtures are fed into a CVD reactor as an initial step. Hydrocarbon sources can include the methane series gases, e.g. methane, ethane, propane; unsaturated hydrocarbons, e.g. ethylene, acetylene, cyclohexene, and benzene; and the like. Methane, however, is preferred. The molar ratio of hydrocarbon to hydrogen broadly ranges from about 1:10 to about 1:1,000 with about 1:100 being preferred. This gaseous mixture optionally may be diluted with an inert gas, e.g. argon. The gaseous mixture is at least partially decomposed thermally hot filament 20 which normally is formed of tungsten, molybdenum, tantalum, or alloys thereof. U.S. Pat. No. 4,707,384 illustrates this process.

The gaseous mixture partial decomposition also can be conducted with the assistance of d.c. discharge or radio frequency electromagnetic radiation to generate a plasma, such as proposed in U.S. Pat. Nos. 4,749,587, 4,767,608, and 4,830,702; and U.S. Pat. No. 4,434,188 with respect to use of microwaves. The twist drills may be bombarded with electrons during the CVD deposition process in accordance with U.S. Pat. No. 4,740,263.

Regardless of the particular method used in generating the partially decomposed gaseous mixture, the twist drills are maintained at an elevated CVD diamond-forming temperature which typically ranges from about 500° to 1100° C. and preferably in the range of about 850° to 950° C. where diamond growth is at its highest rate in order to minimize grain size. Pressures in the range of from about 0.01 to 1000 Torr, advantageously about 1-800 Torr, are taught in the art, with reduced pressure being preferred. Details on CVD processes additionally can be reviewed by reference to Angus, et al., "Low-Pressure Metastable Growth of Diamond and 'Diamondlike' Phases", *Science*, vol. 241, pages 913-921 (Aug. 19, 1988); and Bachmann, et al., "Diamond Thin Films", *Chemical and Engineering News*, pp. 24-39 (May 15, 1989).

The twist drills to be coated are also heated by filament 20 as is the gaseous mixture passed through copper tube 10. In order that the twist drills not be overheated, water or other cooling medium is passed through cooling pipe 12 which preferably has been soldered or welded to copper tube 10. By adjusting the temperature of cooling fluid passed through pipe 12 and its flow rate, the temperature of the twist drills can be maintained within the appropriate CVD diamond-forming temperature range described above. The thickness of the CVD diamond layer on the twist drills is uniform and can be as thin as 1 micrometer on up to 2,000 micrometers or more, depending on processing conditions and most importantly upon time.

It will be appreciated that objects other than twist drills suitably can be disposed within copper tube 10 for coating. Thus, the description herein with reference to twist drills is by way of illustration and not by way of limitation. The following example shows how the present invention has been practiced, but should not be construed as limited. In this application, all units and proportions are by weight, and all units are in the metric system, unless otherwise expressly indicated. Also, all citations referred to herein are expressly incorporated herein by reference.

EXAMPLE

In order to test the reactor configuration design, a small scale test unit was constructed utilizing a ¼ inch thick molybdenum plate through which two K-10 tungsten carbide twist drills were disposed (1 mm diameter, Asahi Diamond Industrial Company). 5 mm of the head end of each of the two twist drills protruded through the copper plate and the inside of the copper plate was disposed 1 cm from a tungsten filament that was 9.5 in in length and 0.03 in in diameter. The tungsten filament was heated between 2,000° and 2,050° C. by connection to 40 amps D.C. and 31.5 D.C. volts. No filament-to-substate bias was used although it must be understood and 31.5 D.C. volt applied to the filament produced a 31.5 volt negative bias on the filament with respect to the substrate at one end of the filament. At the other end of the filament, the substrate and filament were grounded together so that no bias existed there. Hence, the average filament-to-substrate bias was about 16 volts with the filament at the negative potential with respect to the substrate.

The reaction gas composition comprised 1.3 vol.-% methane in hydrogen with a flow rate of 400 SCCM. Pressure was maintained at 11 torr. The run was conducted for 47 hours.

Figure 5:
FIG. 5 is an SEM micrograph at 80× magnification of the head of a twist drill coated with the novel reactor.
Figure 6:
FIG. 6 is an SEM micrograph at 300× magnification of the drill bit of FIG. 5.

Optical inspection of the coated drills showed a uniform diamond coating that covered the head of the drills and the flutes. Even the flutes inside of the hole in the molybdenum plate were coated with diamond. The excellent uniform coating can be seen by reference to FIGS. 5 and 6.

We claim:

1. In a method for coating the CVD diamond elongate objects wherein a flow of hydrogen/hydrocarbon mixture is passed into a vacuum chamber of a diamond reactor held under CVD diamond-forming conditions wherein the mixture is at least partially disassociated for diamond deposition/growth on said substrate, the improvement for coating the entire outside surface of at least a portion of a plurality of stationary elongate objects which comprises passing said feed hydrogen/hydrocarbon mixture through an elongate metal tube disposed within said reactor which tube has a plurality of apertures which hold elongate objects disposed radially inwardly and which has a cooling pipe in thermal contact with and disposed about the outside of said tube, heating to a temperature adequate to initiate hydrocarbon disassociation said mixture with a filament which runs within said tube along the lengthwise extent and which is in electrical connection with the source of voltage for its heating, said heated filament also heating said elongate objects, and passing cooling fluid through said cooling pipe at a temperature and flow rate to maintain the elongate objects at a CVD diamond-forming temperature.

2. The method of claim 1 wherein said elongate objects that are coated with CVD diamond comprise twist drills.

3. The method of claim 1 wherein the ratio of hydrogen to hydrocarbon in said mixture passed into said vacuum chamber ranges from between about 1:10 and 1:1,000.

4. The method of claim 1 wherein said elongate objects are maintained at a temperature of between about 500° and 1100° C.

5. The method of claim 1 wherein a bias voltage is applied to said cylinder.

* * * * *